United States Patent

Avins

[15] 3,678,406

[45] July 18, 1972

[54] VARIABLE GAIN AMPLIFIER

[72] Inventor: Jack Avins, Princeton, N.J.

[73] Assignee: RCA Corporation

[22] Filed: Aug. 26, 1970

[21] Appl. No.: 66,944

[52] U.S. Cl. ..............................330/29, 330/38 M, 330/145, 330/19

[51] Int. Cl. ..........................................................H03g 3/30

[58] Field of Search...................330/19, 29, 38 R, 38 M, 145

[56] References Cited

UNITED STATES PATENTS 3,512,096 5/1970 Magata et al. ...........................330/29

*Primary Examiner*—Roy Lake
*Assistant Examiner*—James B. Mullins
*Attorney*—Eugene M. Whitacre

[57] ABSTRACT

A variable gain direct current coupled amplifier having a fixed DC output level and suitable for fabrication on an integrated circuit chip.

8 Claims, 1 Drawing Figure

PATENTED JUL 18 1972 3,678,406
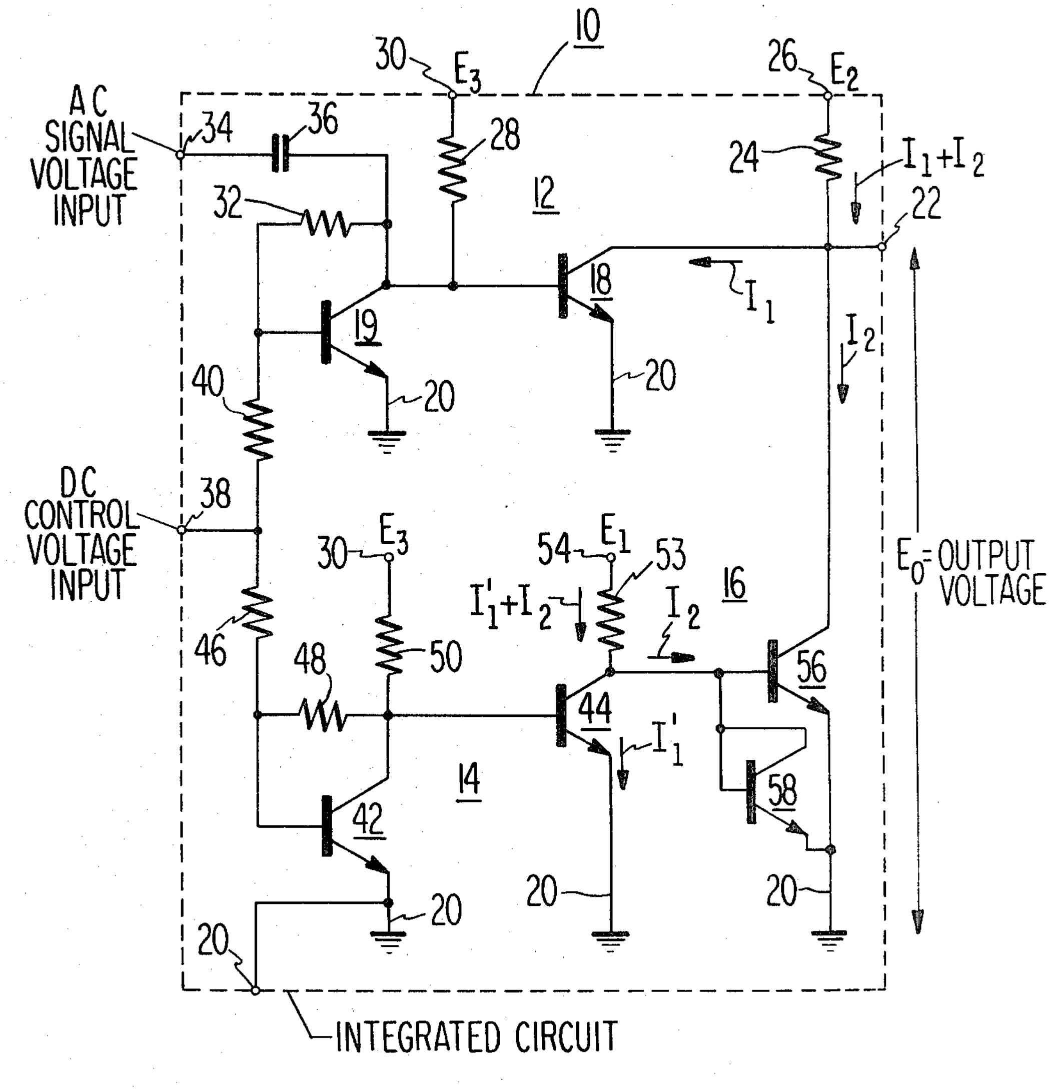
INVENTOR
Jack Avins
BY Martin Sachs
ATTORNEY

VARIABLE GAIN AMPLIFIER

The present invention relates to variable gain amplifiers and more specifically to an adjustable direct current coupled variable gain amplifier having a fixed DC output level, regardless of gain setting, suitable for fabrication with integrated circuit techniques.

The term integrated circuit as used herein refers to a unitary or monolithic semiconductor structure or chip incorporating the equivalent of a network of interconnected active and passive electrical circuit elements such as transistors, diodes, resistors, capacitors and the like.

In the design of variable gain preamplifiers, a control potentiometer is conventionally utilized to vary the amount of output signal. When a potentiometer is used in conjunction with DC coupled amplifiers, the output DC level frequently varies in accordance with the setting of the potentiometer which adjusts the amplifier gain. To eliminate the DC voltage shift from appearing in the load device, capacitor coupling to the load may be required. Another disadvantage to the use of a potentiometer is that noise associated with the movement of the variable contact arm of the control potentiometer is coupled with the signal through the amplifier to the output load.

A circuit incorporating the principles of the invention eliminates noise, generated by noisy controls, from appearing in the output of the amplifier and may be used wherever a variable controlled attenuation is required up to frequencies of 100 megahertz. A basic form of attenuator circuit is disclosed in copending U.S. Pat. application Ser. No. 794,973 of Jack R. Harford, filed Jan. 29, 1969 now U.S. Pat. No. 3,579,133 and assigned to the same assignee as this invention.

The present embodiment of the invention utilizes a first signal translating stage into which is coupled both an AC signal voltage and a DC control voltage, an auxiliary or second translating stage, into which is coupled only the DC control voltage, and a current duplicator circuit for duplicating a second current, flowing in the second translating stage, in a utilization means coupled to the output of the first signal translating stage. The gain of the first signal translating stage is varied in response to the DC control voltage while the DC voltage across the utilization means remains constant regardless of the value of the DC control voltage.

The invention may be better understood by the following detailed description taken in conjunction with the drawing which is a schematic circuit diagram of a variable gain amplifier.

The variable gain amplifier, in one embodiment of the present invention, is fabricated on an integrated circuit chip 10 shown in the Figure and is comprised of a signal translating attenuating amplifier 12, an auxiliary or second translating attenuating amplifier 14, and a current duplicator 16. The signal translating attenuator amplifier 12 is comprised of transistors 18 and 19 operating in the common-emitter mode. The emitter electrodes of transistors 18 and 19 are connected to reference ground 20.

The collector of transistor 18 is connected to output terminal 22 and to one side of a load resistor 24. The other end of resistor 24 is connected to a terminal 26 adapted to be connected to a source of B+ ($E_2$). A resistor 28 couples a source of DC voltage ($E_3$), via terminal 30, to the base electrode of transistor 18 and the collector electrode of transistor 19. A resistor 32 couples the collector electrode to the base electrode of transistor 19.

The AC signal voltage to be translated through the amplifier is applied between terminals 34 and 20 and is coupled through capacitor 36 to the base electrode of transistor 18. The DC control voltage is coupled between terminal 38 and reference ground 20 and is coupled to the base electrode of transistor 19 through resistor 40.

The auxiliary (second) signal translating attenuating amplifier 14 is comprised of transistors 42 and 44 operating in the common-emitter mode. The emitter electrodes of transistors 42 and 44 are coupled to the common reference ground 20. A resistor 46 couples the DC control voltage appearing at terminal 38 to the base electrode of transistor 42. A resistor 48 is connected between the collector and base electrodes of transistor 42. A resistor 50 couples a source of DC voltage ($E_3$) at terminal 30 to the collector electrode of transistor 42 and to the base electrode of transistor 44. A resistor 53 couples a source of DC voltage ($E_1$) at terminal 54 to the collector electrode of transistor 44.

The current duplicator 16 is comprised of transistor 56 and diode 58, which in the present embodiment, is a transistor with its collector electrode connected directly to its base electrode. The collector electrode of transistor 56 is coupled to output terminal 22 and the base electrode of transistor 56 is coupled to the collector electrode of transistor 44. Diode connected transistor 58 has its cathode (emitter) electrode connected to the emitter electrode of transistor 56 and ground reference terminal 20. The anode (collector base) electrode of diode 58 is connected to the base electrode of transistor 56.

The signal translating attenuating amplifier 12 and the auxiliary translating attenuating amplifier 14 in the illustrated embodiment are constructed with the same geometry, in close proximity on a monolithic integrated circuit chip such that the geometry of transistors 18, 19, 42, and 44 are made identical, and resistors 32 and 48; 40 and 46; and 28 and 50 are made equal.

In operation, because of the similarity of construction, the current flowing in the collector electrode of transistor 18 ($I_1$) is equal to the current ($I_1'$) which flows in the collector electrode of transistor 44. The total current flowing through resistor 53, however, equals:

$$I_{53} = E_1 - \phi/R_{53} \text{ Equation (1);}$$

where $\phi$ is approximately equal to 0.7 volt and is a voltage appearing between the emitter and collector electrodes of transistor 44 and across diode 58. The current flowing into the junction of the base electrode of transistor 56 and the anode of diode 58 is referred to as $I_2$; therefore, the current flowing through resistor 53 equals:

$$I_{53} = I_1' + I_2 = I_1 + I_2 \text{ Equation (2).}$$

The current $I_2$ flowing into the base-emitter junction of transistor 56 and diode 58 also flows in the collector electrode of transistor 56, in accordance with the operation of a current duplicator circuit. Diode 58 and transistor 56 have proportionally related conduction characteristics, which may be obtained, for example, by a diode connected transistor coupled between the base and emitter electrodes of transistor 56.

The operation of a current duplicator circuit is explained in detail in a copending application, Ser. No. 866,122 of Steven Steckler filed Oct. 8, 1969, now U.S. Pat No. 3,531,730 and assigned to the same assignee as this invention.

The current $I_{53}$ is substantially constant and determined by the difference in the values of $E_1$ and $\phi$ (Equation 1). A positive DC control voltage coupled between terminal 38 and ground reference 20 causes transistor 42 to conduct more heavily, thereby reducing the amount of current flowing into the base electrode of transistor 44. Similarly, transistor 19 conducts more heavily at the same time, and the current flowing into the base electrode of transistor 18 is reduced the same amount. The collector currents $I_1$ and $I_1'$ therefore, by similarity, will be reduced in equal amounts. The current $I_1'$ plus $I_2$ being a constant requires that $I_2$ increases the same amount that $I_1'$ decreases. Since the current $I_1$ and $I_2$ flow in resistor 24, the output voltage $E_{out}$, between terminals 22 and 20 is given by:

$$E_{out} = E_2 - (E_1 - \phi)R_{24}/R_{53} \text{ Equation (3).}$$

It can be seen from Equation (3) that the DC current flow through resistor 24 remains constant regardless of the value of the DC control voltage. Any noise voltage coupled through the DC control voltage terminal 38 is added to the signal in transistors 18 and 19, as well as to transistors 42 and 44, and causes no change at the output at terminal 22 thereby, resulting in a constant DC output voltage level.

In the present embodiment of the invention, the AC signal voltage is coupled between terminal 34 and ground and is coupled through capacitor 36 to the base electrode of transistor 18. An emitter follower transistor, not shown, may also be used instead of capacitor 36 to couple the AC signal to the base electrode of transistor 18 through resistor 28.

The AC gain of transistor 18 is determined by the amount of DC current shunted away from the base electrode of transistor 18 by transistor 19, which is a function of the DC voltage applied to base electrodes of transistors 19 and 42. Thus the variable gain amplifier will amplify a signal coupled between terminal 34 and ground 20 with a gain which is variable and depends upon a voltage which is coupled between terminal 38 and the reference ground 20.

Because of the symmetry of construction of the auxiliary signal translating attenuating amplifier 14 and the signal translating attenuating amplifier 12, the output is also independent of ripple on the supply voltage $E_3$ which is coupled between terminal 30 and ground reference 20.

For circuits that require a balanced translating amplifier load, the present embodiment may be used, since a push-pull signal may be applied between the collector electrodes of transistors 19 and 42 or through resistors 28 and 50, with the signal current becoming additive in the load resistor 24.

It is also to be noted that if resistor 24 is made equal to resistor 53 the gain through the signal translating attenuating amplifier 12 and the gain through the auxiliary translating attenuating amplifier 14 will become equal. With this condition, the DC output voltage $E_o$ between terminals 22 and 20 may be shown to equal:

$$E_{out}=E_2-E_1+\phi \text{ Equation (4).}$$

For this condition, the output DC level will depend only upon the difference between the supply voltage $E_2$ and $E_1$. If $E_1$ and $E_2$ are made to differ by a constant voltage, such as the drop across a Zener diode, the output $E_0$ will become independent of the supply voltage $E_2$, and consequently independent of any ripple voltage on the supply.

Thus, heretofore has been disclosed a variable gain amplifier capable of operation over an attenuation range of more than 40dB without changes in the DC operating point. As pointed out above, such a circuit may be used in an FM stereo preamplifier, for example, to accomplish DC control of volume with no change in the DC at the output. It can be used anywhere a DC controlled attenuator is desired with a frequency range limited only by the transistors utilized. It may also be used in volume expanders because of the absence of a control transient.

What is claimed is:

1. A signal translating amplifier having a variable gain responsive to a control signal comprising:
   a. first and second transistors each having emitter, base, and collector electrodes, the collector electrode of said first transistor being coupled through first output circuit means to a first terminal adapted for the application of a first source of potential, the collector electrode of said second transistor being coupled through second output circuit means to a second terminal adapted for the application of a second source of potential, the emitter electrodes of said first and second transistors being coupled to a third terminal;
   b. means coupled to the base electrodes of said first and second transistors for establishing a flow of similar first direct currents through said first and second output circuit means, said first and second output circuit means having a second direct current flowing therethrough;
   c. input circuit means coupled to the base electrode of said first transistor for applying signals to be translated;
   d. means coupled to the collector electrode of said second transistor for duplicating said second direct current in said first output circuit means, including a third transistor having emitter, base, and collector electrodes, the collector electrode of said third transistor being coupled to said first output circuit means, the base electrode of said third transistor being coupled to the collector of said second transistor, the emitter electrode of said third transistor being coupled to said third terminal and a diode being coupled from the base to the emitter of said third transistor;
   e. fourth and fifth transistors having base, emitter and collector electrodes, the collector electrode of said fourth transistor being coupled to the base electrode of said first transistor, the collector electrode of said fifth transistor being coupled to the base electrode of said second transistor, the emitter electrodes of said fourth and fifth transistors being coupled to said third terminal; and
   f. means for coupling said control signal to the base electrode of said fourth and fifth transistors to vary the gain of said first transistor while maintaining the DC voltage between the collector of said first transistor and said third terminal substantially constant.

2. A variable gain amplifier according to claim 1 wherein said diode comprises a sixth transistor, having emitter, base, and collector electrodes, the collector and base electrodes of said sixth transistor being directly connected together and coupled to the base electrode of said third transistor, the emitter electrode of said sixth transistor being coupled to the emitter of said third transistor.

3. A variable gain amplifier comprising:

first variable gain means having a gain control signal input terminal and an output terminal, at least first and second transistors direct current coupled between said terminals, said first transistor being connected in a common emitter configuration with a collector electrode coupled to said output terminal, said second transistor having collector and emitter electrodes direct current coupled, respectively, to base and emitter electrodes of said first transistor, means for providing direct current collector to base feedback in said second transistor, and means for coupling said base electrode of said second transistor to said gain control signal input terminal, said second transistor being arranged in a common emitter configuration with respect to said gain control signals, second variable gain means coupled to said gain control signal input terminal and to said output terminal, said second variable gain means having at least third and fourth transistors coupled together in a like manner as said first and second transistors and further having gain control signal inverting means in cascade relation with said third and fourth transistors between said gain control input and output terminals for maintaining a substantially constant quiescent voltage at said output terminal as gain control signals supplied to said input terminal are varied and means for coupling signals to be amplified to at least one of said base electrodes of said first and third transistors, whereby signals produced at said output terminal are variable in amplitude according to gain control signals applied to said first and second means while said quiescent voltage is maintained substantially constant.

4. A variable gain amplifier according to claim 3 wherein:

said means for providing direct current collector to base feedback comprises a resistor, and said gain control signal inverting means comprises a load resistor coupled to the collector of said third transistor and a current duplicator having an input coupled to the junction of said load resistor and said last-named collector and an output coupled to said output terminal.

5. A variable gain amplifier according to claim 4 wherein:

said current duplicator comprises a fifth transistor having emitter, base and collector electrode, said last-named collector being coupled to said output terminal and means having a conduction characteristic proportionally related to that of said fifth transistor connected between said base and emitter of said fifth transistor.

6. A variable gain amplifier according to claim 5 wherein:

said means having a proportionally related conduction characteristic comprises a sixth transistor having direct current coupling between collector and base electrodes and an emitter electrode coupled to the emitter of said fifth transistor.

7. A variable gain amplifier according to claim 6 wherein: substantially identical gain control signals are supplied to said first and second variable gain means, said first and third transistors are substantially identical and said second and fourth transistors are substantially identical.

8. A variable gain amplifier according to claim 7 wherein: said fifth and sixth transistors are substantially identical.

* * * * *